(12) United States Patent  
Mayer et al.

(10) Patent No.: US 7,746,724 B2  
(45) Date of Patent: Jun. 29, 2010

(54) ASYNCHRONOUS DATA TRANSMISSION

(75) Inventors: Peter Mayer, Neubiberg (DE); Wolfgang Spirkl, Germering (DE); Markus Balb, Munich (DE); Christoph Bilger, Munich (DE); Martin Brox, Munich (DE); Thomas Hein, Munich (DE); Michael Richter, Ottobrunn (DE)

(73) Assignee: Qimonda AG, Munich (DE)

( * ) Notice: Subject to any disclaimer, the term of this patent is extended or adjusted under 35 U.S.C. 154(b) by 819 days.

(21) Appl. No.: 11/669,848

(22) Filed: Jan. 31, 2007

(65) Prior Publication Data

US 2008/0183956 A1    Jul. 31, 2008

(51) Int. Cl.  
    *G11C 8/00*    (2006.01)

(52) U.S. Cl. .................. 365/233.14; 365/227

(58) Field of Classification Search ............ 365/233.14; 710/61  
See application file for complete search history.

(56) References Cited

U.S. PATENT DOCUMENTS

| 4,007,421 | A | * | 2/1977 | Lien ........................... 375/254 |
| 4,449,202 | A | | 5/1984 | Knapp et al. |
| 5,666,362 | A | * | 9/1997 | Chen et al. ................... 370/420 |
| 5,841,986 | A | * | 11/1998 | Scherwey .................... 709/236 |
| 6,490,225 | B1 | * | 12/2002 | Millar et al. ................. 365/193 |
| 7,239,669 | B2 | * | 7/2007 | Cummings et al. .......... 375/295 |
| 7,515,453 | B2 | * | 4/2009 | Rajan ........................... 365/63 |
| 2004/0139262 | A1 | | 7/2004 | Beaudoin et al. |
| 2004/0230759 | A1 | | 11/2004 | Braun et al. |
| 2006/0109929 | A1 | | 5/2006 | Tripathi |

FOREIGN PATENT DOCUMENTS

DE    10307548    9/2004

* cited by examiner

*Primary Examiner*—Tan T. Nguyen  
(74) *Attorney, Agent, or Firm*—Patterson & Sheridan, L.L.P.

(57) ABSTRACT

A method and apparatus for accessing a memory device. The method includes providing control signals for an access command to the memory device via an asynchronous interface and transmitting data for the access command to the memory device. The method also includes encoding, into the transmitted data, a clock signal. The encoded clock signal in the transmitted data is used by the memory device for receiving the data transmission.

38 Claims, 5 Drawing Sheets

ASYNCHRONOUS DATA TRANSMISSION

BACKGROUND OF THE INVENTION

Communications within modern computer systems may occur at regular intervals, for example, as governed by a clock signal. For example, during a data transmission, a group of data may be transmitted during each rising edge of the clock signal. Communications performed with a clock signal are often referred to as synchronous communications. Synchronous communications systems may sometimes be preferred over asynchronous communications systems. In asynchronous systems, communications are performed by asserting handshaking signals which indicate when data being transmitted is valid and has been correctly received by the receiving device. Synchronous systems may be preferred over asynchronous systems, for example, because synchronous systems may perform communications more quickly without the overhead of the handshaking signals.

In some cases, different devices in a computers system may inherently perform operations at different speeds, for example, due to differences in both design and manufacturing. Even devices manufactured using the same manufacturing process may also perform operations at different speeds due to process variations between batches and even due to process variations within a single batch. Because different devices in a given system may operate at different speeds with respect to each other and with respect to other systems, it may be difficult to establish a clock frequency to be used with each manufactured system.

In some cases, designers may establish a maximum clock frequency which is low enough so that the majority of components in each manufactured system are capable of performing operations at the established clock frequency. Where a manufactured system is incapable of operating at the established maximum clock frequency, the system may be discarded as defective, thereby increasing waste in the manufacturing process. Furthermore, establishing a common clock frequency for communications systems may result in faster manufactured systems operating unnecessarily slowly at the established clock frequency. Furthermore, operating a system which communicates using a common clock signal may increase power consumption as the common clock signal is continually generated and transmitted to each of the devices in the system.

Accordingly what is need are an improved system, apparatus, and method for performing data transmission.

SUMMARY OF THE INVENTION

Embodiments of the invention generally provide a method and apparatus for accessing a memory device. In one embodiment, the method includes providing control signals for an access command to the memory device via an asynchronous interface and transmitting data for the access command to the memory device. The method also includes encoding, into the transmitted data, a clock signal. The encoded clock signal in the transmitted data is used by the memory device for receiving the data transmission.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method and apparatus for accessing a memory device. In one embodiment, the method includes providing control signals for an access command to the memory device via an asynchronous interface and transmitting data for the access command to the memory device. The method also includes encoding, into the transmitted data, a clock signal. The encoded clock signal in the transmitted data is used by the memory device for receiving the data transmission. By using asynchronous control with high-speed synchronous data transmission, each of the devices transferring data may transfer the data at a rate very close to their internal delay, thereby increasing the data transfer rate.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The following is a detailed description of embodiments of the invention depicted in the accompanying drawings. The embodiments are examples and are in such detail as to clearly communicate the invention. However, the amount of detail offered is not intended to limit the anticipated variations of embodiments; but on the contrary, the intention is to cover all modifications, equivalents, and alternatives falling within the spirit and scope of the present invention as defined by the appended claims.

Figure 1:
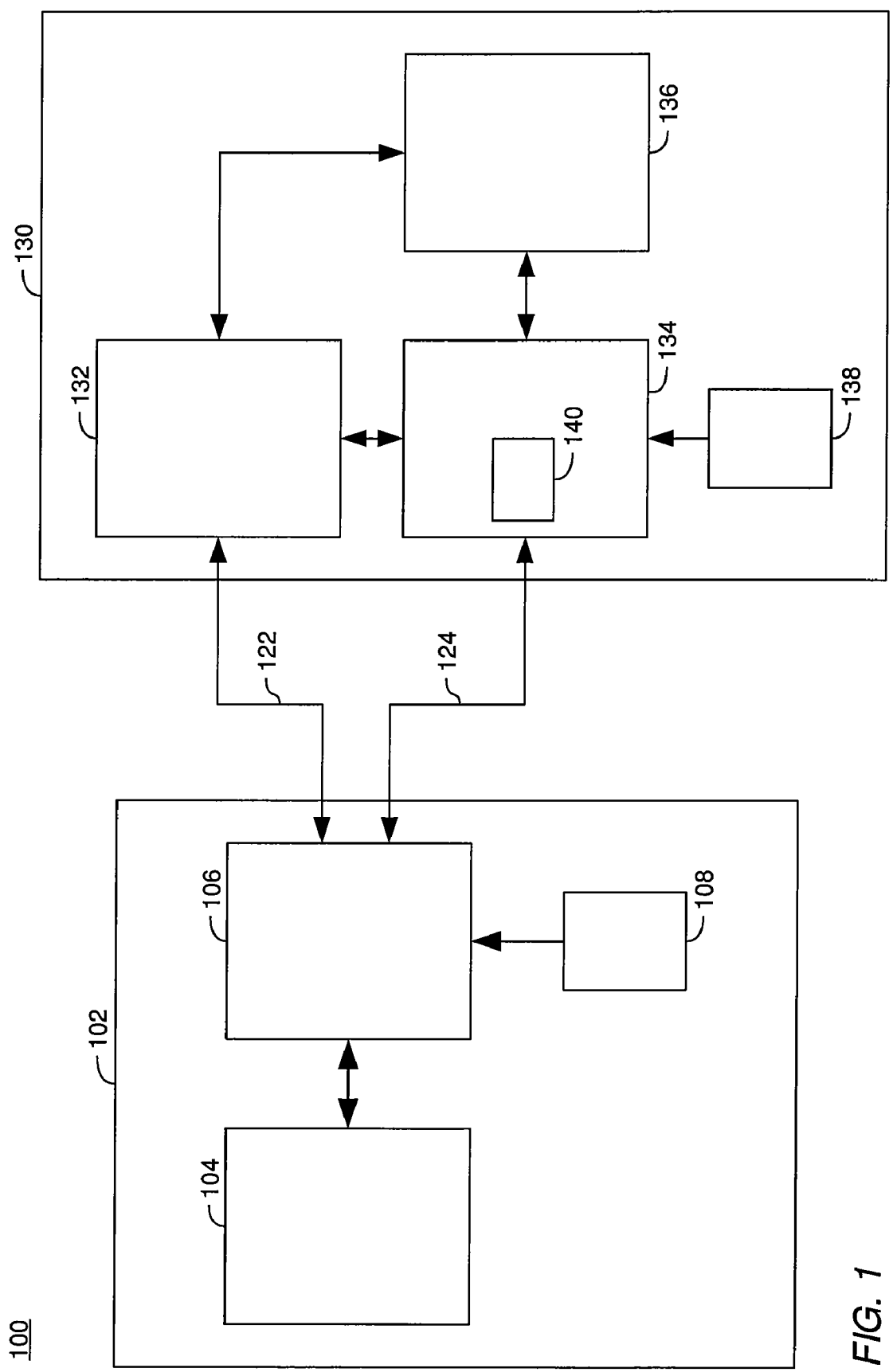
FIG. 1 is a block diagram depicting an exemplary system according to one embodiment of the invention.

FIG. 1 is a block diagram depicting an exemplary system 100 according to one embodiment of the invention. As depicted, the system 100 may include a processor 102 such as a central processor unit, graphical processor unit, or memory controller. The processor 102 may be configured to access a memory device 130. The memory device 130 may be a dynamic random access memory (DRAM) device such as a synchronous DRAM (SDRAM) device, double data rate (DDR) DRAM device. The memory device 130 may also be a static RAM (SRAM) device or nonvolatile memory device such as a flash memory device or magnetic RAM (MRAM) device.

In one embodiment, the processor 102 may include control circuitry 104 configured to execute instructions. The executed instructions may be used to access the memory device 130 using input/output (I/O) circuitry 106 of the processor 102. The processor may also include a local clock generator (LCG) circuit 108 which may be used to time communications between the processor 102 and the memory device 130 as described below.

In one embodiment, the memory device 139 may include control circuitry 132 configured to receive command signals from the processor 102. Upon receiving commands from the processor 102, the control circuitry may be configured to perform access operations (e.g., reads and/or writes) to one or more memory arrays 136 of the memory device 130. Data for the access operations may be transmitted between the processor 102 and the memory device 130 using I/O circuitry 134 of the memory device 130. The I/O circuitry 134 may include a data queue 140 into which data received by the memory device 130 may be placed. As described below, an LCG circuit 138 may also be used to time communications between the processor 102 and memory device 130.

In one embodiment of the invention, the processor 102 and memory device 130 may communicate with each other via an interface which is partially asynchronous and partially synchronous. For example, the processor 102 may be configured to provide control signals for an access command to the memory device 130 via an asynchronous interface 122 while transmitting data for the access command to the memory device 130 synchronously across a data bus 124. Timing for the transmitted data may be performed, for example, by encoding into the transmitted data a clock signal. The memory device 130 may use the encoded clock signal to receive the transmitted data.

By using an asynchronous command interface 122, power consumption associated with clocking synchronous command interfaces may be reduced. By transferring data synchronously across the data bus 124, overhead (e.g., handshaking) associated with asynchronous data transfers may be reduced or avoided in some cases, thereby providing increased data transmission rates.

Figure 2:
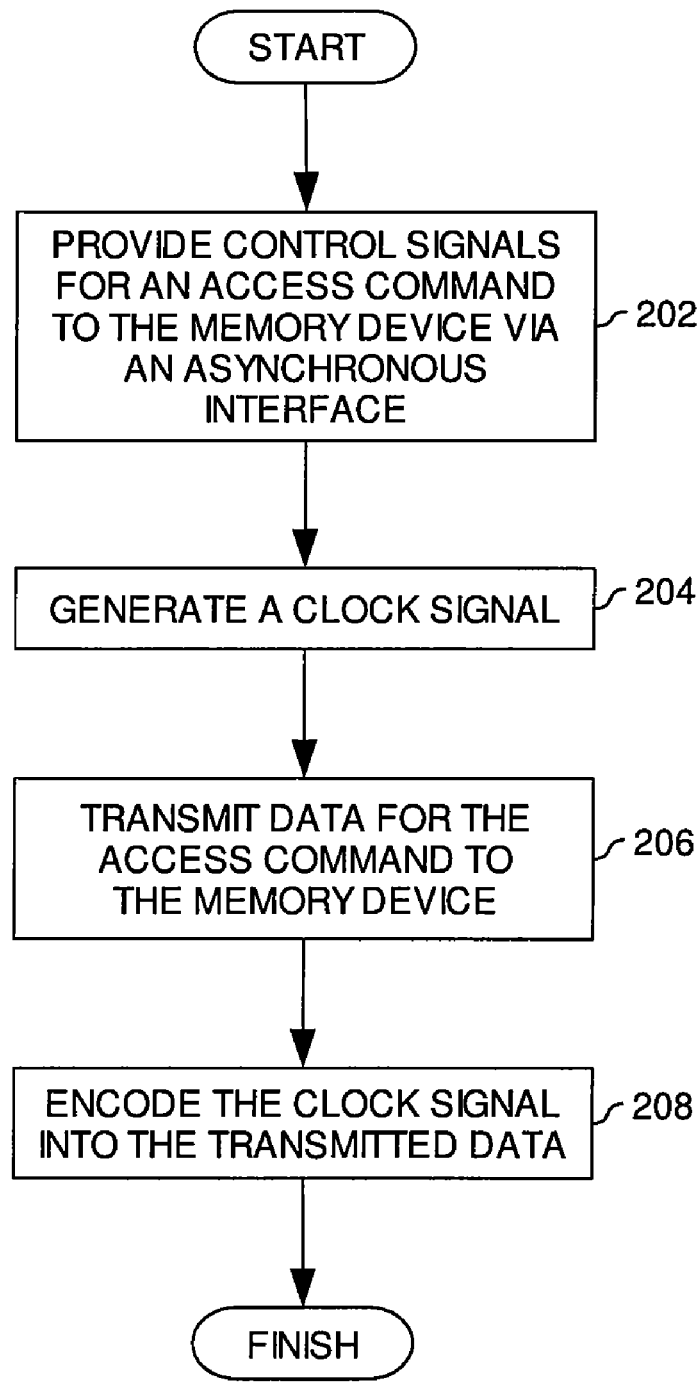
FIG. 2 is a block diagram depicting a process for accessing the memory device according to one embodiment of the invention.

FIG. 2 is a block diagram depicting a process 200 for accessing the memory device 130 according to one embodiment of the invention. The process 200 may be performed, for example, by the processor 102. The process 200 begins at step 202 where control signals for an access command are provided to the memory device 130 via an asynchronous interface 122. The control signals may, for example, include command signals indicating the type of command as well as handshaking signals indicating when a valid command has been presented via the interface 122.

At step 204 a clock signal may be generated by the processor 102. The clock signal may be generated using the local clock generator circuit 108. In one embodiment, the clock signal may be generated constantly by the processor 102. Optionally, in another embodiment, the clock signal used to transmit data may only be generated by the local clock generator circuit 108 while a data transmission is being performed from the processor 102 to the memory device 130. In some cases, another clock signal may be generated and used by the processor 102 for other processing. The other clock signal may, for example, have a lower frequency than the clock signal used to transmit data, thereby reducing power consumption within the processor 102.

At step 206, data for the access command may be transmitted to the memory device 102. At step 208, while the data is being transmitted, the generated clock signal may be encoded into the transmitted data. Any appropriate encoding scheme may be used to encode the clock signal into the transmitted data. For example, Manchester phase encoding, differential Manchester encoding, eight-to-ten bit encoding, or multi-level transition encoding may be used.

Figure 3:
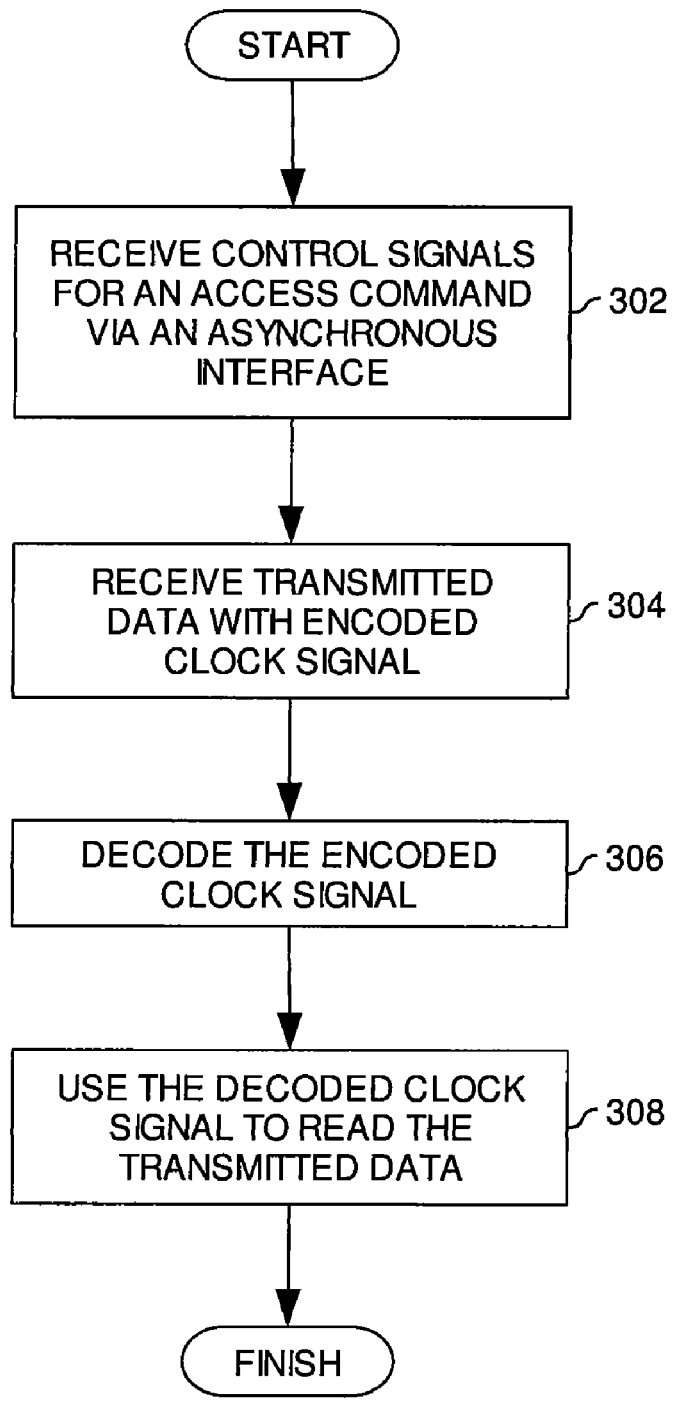
FIG. 3 is a flow diagram depicting a process for performing an access using an encoded clock signal according to one embodiment of the invention.

FIG. 3 is a flow diagram depicting a process 300 for performing an access (e.g., from the perspective of the memory device 130) according to one embodiment of the invention. The process 300 may be performed, for example, by the memory device 130 during a write operation where data is written from the processor 102 to the memory device 130. At step 302, control signals for an access command may be received via the asynchronous interface 122. At step 304, data transmitted via the data bus 124 with an encoded clock signal may be received by the memory device 130. At step 306, the encoded clock signal may be decoded and at step 308 the decoded clock signal may be used to read the transmitted data into the memory device 130. For example, the decoded clock signal may be used to latch the received data into the input queue 140 of the memory device 130.

Figure 4:
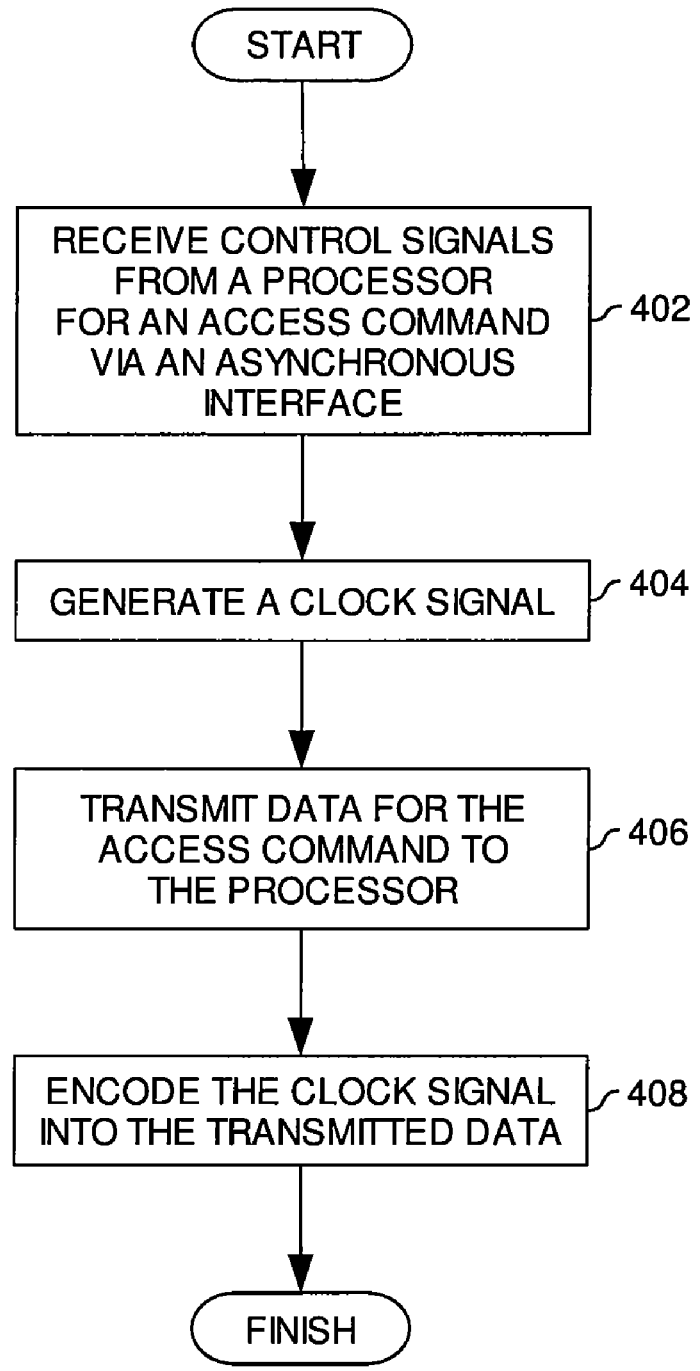
FIG. 4 is a flow diagram depicting a process for transmitting data from the memory device to the processor according to one embodiment of the invention.

FIG. 4 is a flow diagram depicting a process 400 for transmitting data from the memory device 130 to the processor 102 according to one embodiment of the invention. Such a transfer may be performed by the memory device 130, for example, in response to receiving a read command from the processor 102. The process 400 may begin at step 402 where control signals for an access command are received from the processor 102 via the asynchronous command interface 122. At step 404, a clock signal may be generated by the memory device 130, for example, using the local clock generator circuitry 138. At step 406, data for the access command may be transmitted to the processor 102. At step 408, while the data is being transmitted, the generated clock signal may be encoded into the transmitted data. The process 102 may use the encoded clock signal to receive the transmitted data, for example, as described above with respect to the memory device's process 300 of receiving transmitted data.

As mentioned above, in one embodiment, the processor 102 and the memory device 130 may only generate the clock signal used to transmit data when the particular device is transmitting data. For example, the local clock generator circuitry 108 on the processor 102 may only generate the clock signal for data transmission when the processor 102 is transmitting data to the memory device 130. Similarly, the local clock generator circuitry 138 of the memory device 130 may only generate the clock signal for data transmission when the memory device 130 is transmitting data to the processor 102. In each case, the clock signal may only be generated, for example, from the time an access command is being issued or received until the time when the command has been completed. Optionally, in one embodiment, the clock signal for a given device may only be generated when the device is not placed in a standby mode. In some cases, by reducing the amount of time for which the clock signal is generated in a given device 102, 130, power consumption in the system 100 may be reduced.

In some cases, because the system 100 may not use a clock signal distributed between the processor 102 and memory device 130 for communications purposes, the memory device 130 and/or processor 102 may not include certain synchronization circuitry such as a phase-locked loop circuit or a delay-locked loop circuit. By omitting such circuits from the memory device 130 and/or processor 102, power consumption within the system 100 may be reduced. Furthermore, in one embodiment, no clock signal (other than the encoded clock signal used during data transmission) may be transmitted/shared between the memory device 130 and the processor 102.

In one embodiment of the invention, data may also be transmitted between the memory device 130 and the processor 102 using asynchronous data transfer. For example, in one embodiment, communications between the processor 102 and the memory device 130 may be performed in either a fast mode (as described above) or a slow mode, where asynchronous handshaking signals are used to transmit data between the processor 102 and the memory device 130. In one embodiment of the invention, the command signals may also be transmitted synchronously from the processor 102 to the memory device 130 using a clock signal encoded into the command signals. Thus, the data and control signals may be transmitted using a single bus 124 while asynchronous signals 122 may be used to indicate when transmitted commands and/or data are valid.

In one embodiment of the invention, the local clock generators 108, 138 on each device 102, 130 may be a ring oscillator (e.g., an oscillator formed from gates of the device 102, 130). Because the ring oscillator may be formed using the same manufacturing process from which the device 102, 130 is manufactured, the ring oscillator may operate as quickly or as slowly as other circuitry of the device 102, 130, and may thus provide inherently optimal timing with respect to other circuitry of the device 102, 130. For example, if the manufactured processor 102 operates at a higher frequency than other processors manufactured using the same process, then the clock generator 108 for the processor 102 may also produce a higher-frequency clock signal for data transmission.

In one embodiment, the frequency of the clock signal generated by the processor 102 and/or memory device 130 may be adjusted, for example, to maximize the transmission speed between the devices. As described above, where the local clock generator 108, 138 on each device provides optimal internal timing with respect to that device 102, 130, determining a maximum, compatible transmission frequency for the devices 102, 130 may maximize the transmission speed between the devices 102, 130. This may allow the devices 102, 130 to operate as closely as possible to their maximum possible transmission frequency when transmitting data.

Figure 5:
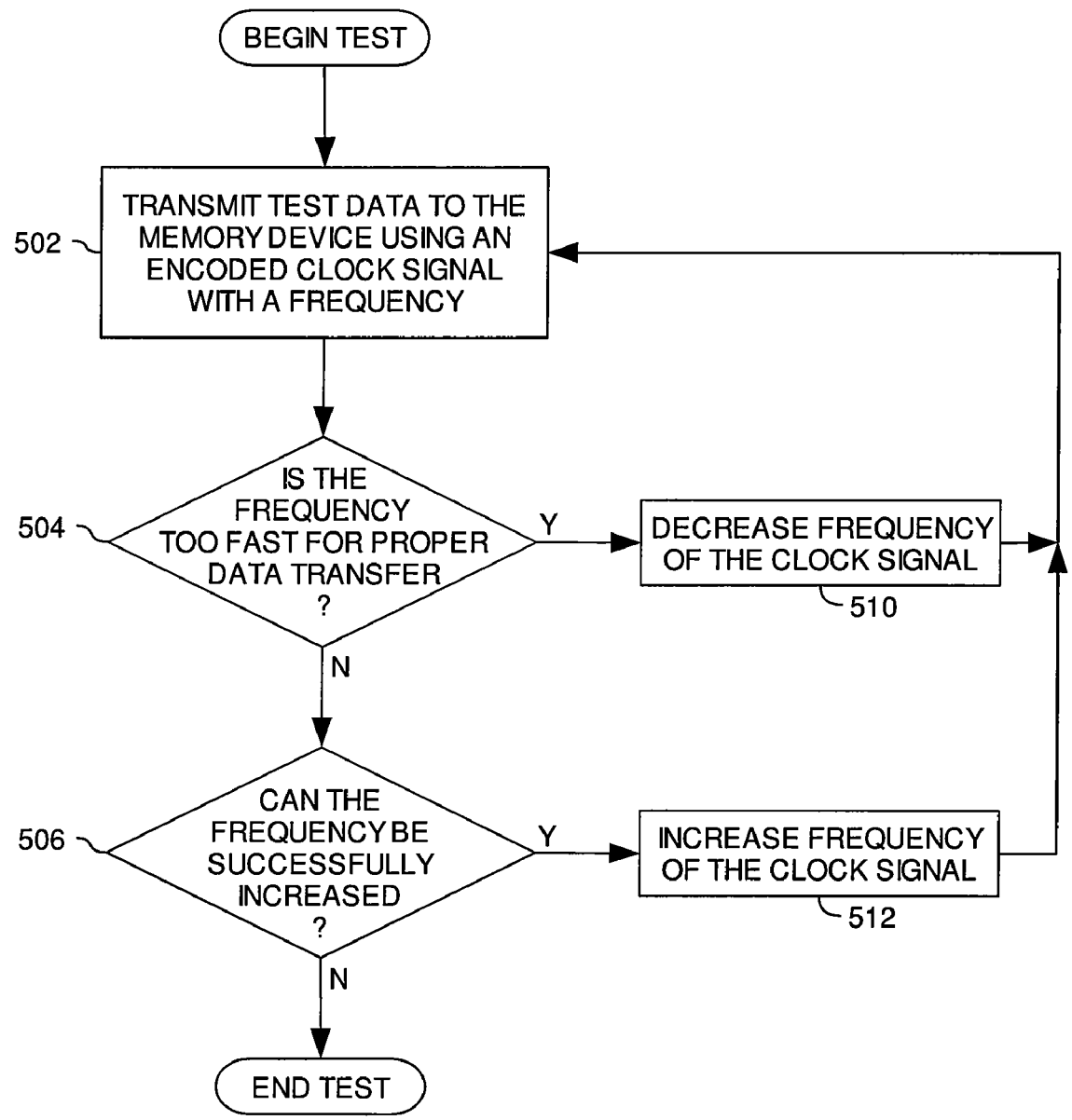
FIG. 5 is a block diagram depicting a process for adjusting the frequency of a clock signal according to one embodiment of the invention.

FIG. 5 is a block diagram depicting a process 500 for adjusting the frequency of a clock signal according to one embodiment of the invention. The process 500 may be performed, for example, while one or more of the devices 102, 130 are placed in a test mode. Optionally, the process 500 may be performed outside of a test mode. For example, in some cases, the process 500 may also be performed intermittently (e.g., after a change in operating conditions is detected, after a predetermined time period, or after a certain number of operations has been performed) in order to maintain optimal timing between the devices 102, 130. The process 500 may also be performed, for example, where an error in data transmission is detected. In one embodiment, such an error may be detected via asynchronous signals 122 transmitted between the devices 102, 130.

In one embodiment, the process 500 begins at step 502 where test data is transmitted to the memory device 130 using an encoded clock signal with a given frequency (for example, the frequency may be a default frequency or a maximum frequency for the processor 102). At step 504, a determination may be made of whether the frequency is too fast for proper data transfer between the processor 102 and the memory device 130. For example, the memory device 130 may transmit the data back to the processor 102 to be checked, the processor 102 may read back the data previously transmitted, or asynchronous control signals 122 may be used to indicate whether the data was successfully transmitted. As another option, the memory device 130 may merely assert a signal indicating that the frequency received was too fast. If the frequency is too fast, then at step 510 the frequency may be reduced and the test may, for example, be repeated beginning at step 502.

If a determination is made that the frequency is not too fast, in some cases (where the frequency of the clock signal can be increased), as determination may be made of whether the frequency can be successfully increased (step 506). For example, the frequency may be increased until the data transmission fails, at which point the frequency may be returned to the fastest successful transmission frequency. Optionally, the memory device 130 may include circuitry which indicates whether further frequency increases will be successful. If the frequency can be successfully increased, the frequency may be increased at step 512. The test may then be repeated, if necessary, beginning at step 502. After the optimum frequency for data transmission between the memory device 130 and the processor 102 has been determined, the test may conclude.

While the foregoing is directed to embodiments of the present invention, other and further embodiments of the invention may be devised without departing from the basic scope thereof, and the scope thereof is determined by the claims that follow.

What is claimed is:

1. A method of accessing a memory device, comprising:
   providing control signals for an access command to the memory device via an asynchronous interface;
   transmitting data for the access command to the memory device via a synchronous interface; and
   encoding, into the transmitted data, a clock signal, wherein the encoded clock signal in the transmitted data is used by the memory device for receiving the data transmission.

2. The method of claim 1, wherein the clock signal is encoded into the transmitted data using an eight-to-ten bit encoding scheme.

3. The method of claim 1, wherein the memory device does not include a phase-locked loop circuit and wherein the memory device does not include a delay-locked loop circuit.

4. The method of claim 1, wherein the clock signal is generated only during transmission of the data.

5. The method of claim 1, wherein the memory device uses the encoded clock signal to input the transmitted data into an input queue circuit.

6. The method of claim 1, further comprising:
   determining if a frequency of the clock signal is higher than a desired frequency for the memory device; and
   if the frequency of the clock signal is higher than the desired frequency, reducing the frequency of the clock signal to match the desired frequency.

7. The method of claim 1, further comprising:
   receiving second data transmitted from the memory device, wherein the second data includes a second encoded clock signal generated by the memory device.

8. A processor, comprising:
circuitry configured to:
provide control signals for an access command to a memory device via an asynchronous interface;
transmit data for the access command to the memory device via a synchronous interface; and
encode, into the transmitted data, a clock signal, wherein the encoded clock signal in the transmitted data is used by the memory device for receiving the data transmission.

9. The processor of claim 8, wherein the circuitry is configured to encode the clock signal into the transmitted data using an eight-to-ten bit encoding scheme.

10. The processor of claim 8, wherein the memory device does not include a phase-locked loop circuit and wherein the memory device does not include a delay-locked loop circuit.

11. The processor of claim 8, wherein the circuitry is configured to generate the clock signal only during transmission of the data.

12. The processor of claim 8, wherein the memory device is configured to use the encoded clock signal to input the transmitted data into an input queue circuit.

13. The processor of claim 8, wherein the circuitry is further configured to:
determine if a frequency of the clock signal is higher than a desired frequency for the memory device; and
if the frequency of the clock signal is higher than the desired frequency, reduce the frequency of the clock signal to match the desired frequency.

14. The processor of claim 8, wherein the circuitry is further configured to:
receive second data transmitted from the memory device, wherein the second data includes a second encoded clock signal generated by the memory device.

15. A memory device comprising:
a memory array; and
circuitry configured to:
receive control signals for an access command to the memory device via an asynchronous interface;
receive data for the access command to the memory device via a synchronous interface; and
receive, encoded in the transmitted data, a clock signal, wherein the encoded clock signal in the transmitted data is used by the memory device for receiving the data transmission.

16. The memory device of claim 15, wherein the clock signal is encoded into the transmitted data using an eight-to-ten bit encoding scheme.

17. The memory device of claim 15, wherein the memory device does not include a phase-locked loop circuit and wherein the memory device does not include a delay-locked loop circuit.

18. The memory device of claim 15, wherein the clock signal is generated only during transmission of the data.

19. The memory device of claim 15, wherein the memory device uses the encoded clock signal to input the transmitted data into an input queue circuit.

20. The memory device of claim 15, further comprising:
determining if a frequency of the clock signal is higher than a desired frequency for the memory device; and
if the frequency of the clock signal is higher than the desired frequency, indicate to a transmitting device that the frequency of the clock signal should be reduced.

21. The memory device of claim 15, wherein the circuitry is further configured to:
transmit second data from the memory device, wherein the second data includes a second encoded clock signal generated by the memory device.

22. The memory device of claim 15, wherein the memory device is a dynamic random access memory device.

23. A system comprising:
a memory device; and
a processor configured to:
provide control signals for an access command to the memory device via an asynchronous interface;
transmit data for the access command to the memory device via a synchronous interface; and
encode, into the transmitted data, a clock signal, wherein the encoded clock signal in the transmitted data is used by the memory device for receiving the data transmission.

24. The system of claim 23, wherein the clock signal is encoded into the transmitted data using an eight-to-ten bit encoding scheme.

25. The system of claim 23, wherein the memory device does not include a phase-locked loop circuit and wherein the memory device does not include a delay-locked loop circuit.

26. The system of claim 23, wherein the clock signal is generated by the processor only during transmission of the data.

27. The system of claim 23, wherein the memory device is configured to use the encoded clock signal to input the transmitted data into an input queue circuit.

28. The system of claim 23, wherein the processor is further configured to:
determine if a frequency of the clock signal is higher than a desired frequency for the memory device; and
if the frequency of the clock signal is higher than the desired frequency, reduce the frequency of the clock signal to match the desired frequency.

29. The system of claim 23, wherein the processor is further configured to:
receiving second data transmitted from the memory device, wherein the second data includes a second encoded clock signal generated by the memory device.

30. The system device of claim 23, wherein the memory device is a dynamic random access memory device.

31. A method of accessing a memory device, comprising:
transmitting control signals for an access command to the memory device via a synchronous interface;
transmitting data for the access command to the memory device via the synchronous interface; and
encoding, into the transmitted data and the control signals, a clock signal, wherein the encoded clock signal in the transmitted data and control signals is used by the memory device for receiving the data transmission and the control signals.

32. The method of claim 31, wherein the clock signal is encoded into the transmitted data using an eight-to-ten bit encoding scheme.

33. The method of claim 31, wherein the memory device does not include a phase-locked loop circuit and wherein the memory device does not include a delay-locked loop circuit.

34. The method of claim 31, wherein the clock signal is generated only during transmission of the data and control signals.

35. The method of claim 31, wherein the memory device uses the encoded clock signal to input the transmitted data into an input queue circuit.

36. The method of claim 31, further comprising:
determining if a frequency of the clock signal is higher than a desired frequency for the memory device; and if the frequency of the clock signal is higher than the desired frequency, reducing the frequency of the clock signal to match the desired frequency.

37. The method of claim 31, further comprising:
receiving second data transmitted from the memory device, wherein the second data includes a second encoded clock signal generated by the memory device.

38. The method of claim 31, further comprising:
providing asynchronous control signals to the memory device via an asynchronous interface, wherein the asynchronous control signals indicate when information being transmitted to the memory device is valid.

* * * * *